United States Patent
Zhang et al.

(10) Patent No.: US 9,461,545 B2
(45) Date of Patent: Oct. 4, 2016

(54) BOOST CONVERTER WITH CIRCUIT FOR BODY SWITCHING OF THE RECTIFICATION TRANSISTOR

(71) Applicant: STMicroelectronics (Shenzhen) R&D Co. Ltd, Shenzhen (CN)

(72) Inventors: Hai Bo Zhang, Shenzhen (CN); Sanford Li, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 130 days.

(21) Appl. No.: 14/493,436

(22) Filed: Sep. 23, 2014

(65) Prior Publication Data
US 2016/0065066 A1   Mar. 3, 2016

(30) Foreign Application Priority Data
Aug. 29, 2014  (CN) .......................... 2014 1 0448298

(51) Int. Cl.
| H02M 3/158 | (2006.01) |
| H02M 1/36 | (2007.01) |
| H03K 17/04 | (2006.01) |

(52) U.S. Cl.
CPC ............. *H02M 3/1588* (2013.01); *H02M 1/36* (2013.01); *H02M 3/158* (2013.01); *H03K 17/04* (2013.01)

(58) Field of Classification Search
CPC .. H02M 3/1588; H02M 1/4225; H02M 1/36; Y02B 70/36; Y02B 70/1466
See application file for complete search history.

(56) References Cited

U.S. PATENT DOCUMENTS

| 5,929,615 | A | * | 7/1999 | D'Angelo | ............... | G05F 1/618 323/222 |
| 7,084,611 | B2 | * | 8/2006 | Kirchner | ............. | H02M 3/1582 323/222 |
| 2009/0189447 | A1 | * | 7/2009 | Murakami | .......... | H03M 3/1584 307/31 |

* cited by examiner

*Primary Examiner* — Fred E Finch, III
*Assistant Examiner* — Peter Novak
(74) *Attorney, Agent, or Firm* — Gardere Wynne Sewell LLP (57) ABSTRACT

A first softstart signal indicates operation in a load phase for a boost rectifier and a second softstart signal indicates operation in a pulse drive phase which follows the load phase. A rectification transistor is actuated for the duration of the load phase in response to the first softstart circuit to generate a rising output voltage. The rectification transistor is further repeatedly actuated during the pulse drive phase in response to the second softstart circuit to generate a boosted output voltage. A first transistor coupled between a first conduction terminal and a body terminal of the rectification transistor is actuated, and a second transistor coupled between the body terminal and a second conduction terminal of the rectification transistor is deactuated, during the load phase. The first transistor is deactuated, and the second transistor is actuated, during the pulse drive phase.

21 Claims, 4 Drawing Sheets

BOOST CONVERTER WITH CIRCUIT FOR BODY SWITCHING OF THE RECTIFICATION TRANSISTOR

PRIORITY CLAIM

This application claims priority from Chinese Application for Patent No. 201410448298.2 filed Aug. 29, 2014, the disclosure of which is incorporated by reference.

TECHNICAL FIELD

This disclosure relates generally to boost converter circuits, and more particularly to a circuit for use in a boost converter in order to control shutdown current.

BACKGROUND

DC/DC converter circuits are widely used in battery-powered portable devices. Examples of such devices include: a smart phone, a smart watch, a camera, a media player and a number of other portable digital devices. For a boost-type converter, the circuit operates to receive a DC input voltage (from the battery) and generate a DC output voltage, where the magnitude of the DC output voltage exceeds the magnitude of the DC input voltage. In order to extend battery life, those skilled in the art recognize a need control leakage current between input and output, especially during shutdown.

SUMMARY

In an embodiment, a circuit comprises a boost converter having: an input node; an output node; a rectification transistor coupled between the input and output node and having a body terminal; a first transistor coupled between the input node and the body terminal; and a second transistor coupled between the body terminal and the output node. The circuit further comprises: a softstart circuit configured to receive a softstart signal and generate in response thereto a first control signal applied to a control terminal of the rectification transistor; and a drive circuit configured to generate a second control signal applied to a control terminal of the first transistor and further configured to receive the softstart signal and generate in response thereto a third control signal applied to a control terminal of the second transistor.

In an embodiment, a circuit comprises: a boost circuit including a rectification transistor having first and second conduction terminals and a body terminal; a first transistor coupled between the first conduction terminal and the body terminal; and a second transistor coupled between the body terminal and the second conduction terminal; and a control circuit configured to control operation of said boost circuit. The control circuit comprises: a softstart circuit configured to receive a first softstart signal indicating a load phase and a second softstart signal indicating a pulse drive phase following said load phase, the softstart circuit operable to actuate the rectification transistor for the duration of the load phase in response to the first softstart circuit and further operable to pass a pulse signal to control actuation of the rectification transistor during the pulse drive phase; and a body control circuit configure to control actuation of the first and second transistors in response to the first and second softstart signals, the body control circuit operable when the first softstart signal is active and the second softstart signal is deactive to actuate the first transistor and deactuate the second transistor, and further operable when the second softstart signal is active to deactuate the first transistor and actuate the second transistor.

In an embodiment, a method comprises: receiving a first softstart signal indicating operation in a load phase for a boost rectifier; actuating a rectification transistor for the duration of the load phase in response to the first softstart circuit to generate an output voltage rising towards a level of an input voltage, said rectification transistor having first and second conduction terminals and a body terminal; receiving a second softstart signal indicating operation in a pulse drive phase, following said load phase, for said boost rectifier; passing a pulse signal to control repeated actuation of the rectification transistor during the pulse drive phase to generate a boosted output voltage; actuating a first transistor coupled between the first conduction terminal and the body terminal, and deactuating a second transistor coupled between the body terminal and the second conduction terminal, during the load phase to boost said output voltage in excess of the input voltage; and actuating the second transistor coupled between the body terminal and the second conduction terminal, and deactuating the first transistor coupled between the first conduction terminal and the body terminal, during the pulse drive phase.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 1:
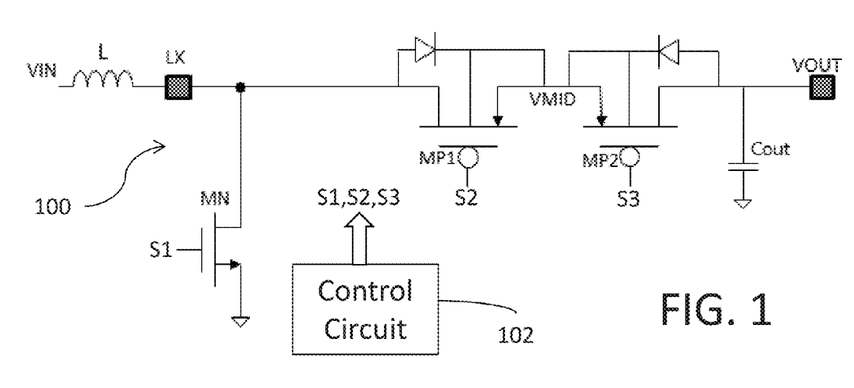
FIG. 1 is a circuit diagram of an embodiment for a boost converter.

Reference is now made to FIG. 1 showing a circuit diagram of an embodiment for a boost converter 100. The circuit 100 includes a node LX. An inductor L is coupled between the node LX and a power supply input node VIN configured to receive an input voltage. A shunt transistor MN is coupled between the node LX and a reference supply node (for example, ground). The transistor MN may, for example, comprise an n-channel MOSFET transistor, having a source-drain path coupled between the node LX and the reference supply node. The control terminal (gate) of transistor MN is configured to receive a switching signal S1. The circuit 100 further includes a pair of series connected transistors MP1 and MP2 coupled between the node LX and an output node VOUT. The transistors MP1 and MP2 may, for example, comprise p-channel MOSFET transistors having source-drain paths coupled in series with each other (at node VMID) between the node LX and the node VOUT. The control terminal (gate) of transistor MP1 is configured to receive a switching signal S2. The control terminal (gate) of transistor P2 is configured to receive a switching signal S3. A capacitor Cout is coupled between the output node VOUT and the reference supply node. The transistor MP1 comprises a rectification transistor and the transistor MP2 comprises a load transistor.

In one example implementation, the node LX may comprise a package pin of an integrated circuit device with the inductor L provided as an external circuit component. In another example implementation, the node VOUT may comprise a package pin of the integrated circuit device. The capacitor Cout may be provided as an internal circuit component (as shown) or an external circuit component. In yet another implementation, the node VOUT may comprise a node internal to the integrated circuit device which is configured to supply a boosted DC voltage to other circuitry also implemented within that integrated circuit device.

The switching signals S1, S2 and S3 are generated by a control circuit 102. The load transistor MP2 is actuated by the control signal S3 whenever the device is operational. The control circuit 102 then actuates shunt transistor MN through the control signal S1 to couple the inductor L between the supply node VIN and the reference supply node. A current flows through the inductor L and the voltage across the inductor terminals increases. The control circuit then deactuates transistor MN and actuates the rectification transistor MP1 through the control signal S2. Current is then passed through transistors MP1 and MP2 and dumped into the output capacitor Cout. The control circuit then deactuates transistor MP1 and the process is repeated. As a result, the voltage stored in capacitor Cout, and made available at the output node VOUT, rises to a level that exceeds the voltage at the input node VIN.

When the circuit 100 is shut down, the transistors MP1 and MP2 are both turned off. The body diodes of these transistors are reversed biased and thus there is no path for current leakage between the nodes VIN and VOUT. The voltage at the node VMID will migrate to the higher of the two voltages made available at the nodes VIN and VOUT.

Noted drawbacks of the circuit 100 include a) the need for two pMOS devices (MP1 and MP2) which occupy a large area on the integrated circuit and b) a lower efficiency because the transistor MP1, which functions as the switching transistor for output rectification, needs to be twice as large in order to keep the Rdson value small but nonetheless still produces an increased switching loss.

Figure 2:
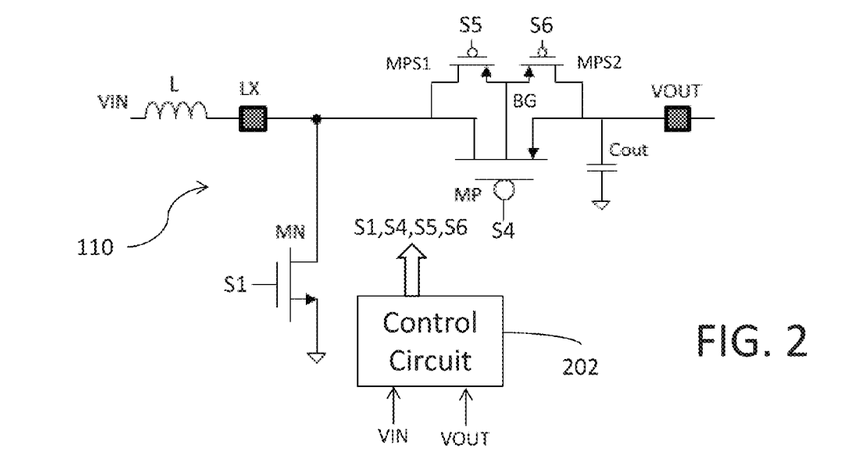
FIG. 2 is a circuit diagram of an embodiment for a boost converter.

Reference is now made to FIG. 2 showing a circuit diagram of an embodiment for a boost converter 110. Like references with respect to the circuit 100 of FIG. 1 refer to like or similar parts. The circuit 110 includes a rectification transistor MP coupled between the node LX and an output node VOUT. The transistor MP may, for example, comprise a p-channel MOSFET transistor, with its source-drain path coupled between the node LX and the node VOUT. The control terminal (gate) of transistor MP is configured to receive a switching signal S4. The circuit 110 further comprises a pair of series connected body control transistors MPS1 and MPS2 coupled between the node LX and an output node VOUT. The transistors MPS1 and MPS2 may, for example, comprise p-channel MOSFET transistors, with their source-drain paths coupled in series with each other (at node BG) between the node LX and the node VOUT. The node BG is coupled to the body terminal of transistor MP. The control terminal (gate) of transistor MPS1 is configured to receive a switching signal S5. The control terminal (gate) of transistor MPS2 is configured to receive a switching signal S6. The series connected transistors MPS1 and MPS2 are thus connected in parallel with the transistor MP. Transistors MPS1 and MPS2 will typically be much smaller devices than transistor MP.

The transistors MPS1 and MPS2 function to control the body connection of the transistor MP. If the voltage at node VIN is greater than the voltage at node VOUT, the control circuit 102 functions to actuate transistor MPS1 to couple the body of transistor MP at node BG to the drain of transistor MP (see, FIG. 3A) and prevent leakage current from input to output with a reverse biased body diode provided by transistor MPS2. Conversely, if the voltage at node VOUT is greater than the voltage at node VIN, the control circuit 102 functions to actuate transistor MPS2 to couple the body of transistor MP at node BG to the source of transistor MP (see, FIG. 3B) and prevent leakage current from output to input with a reverse biased body diode provided by transistor MPS1.

The switching signals S1, S4, S5 and S6 are generated by a control circuit 202. The control circuit 202 first actuates shunt transistor MN through the control signal S1 to couple the inductor L between the supply node VIN and the reference supply node. A current flows through the inductor L and the voltage across the inductor terminals increases. The control circuit then deactuates transistor MN and actuates the transistor MP through the control signal S4. Current is then passed through transistor MP dumped into the output capacitor Cout. The control circuit then deactuates transistor MP and the process is repeated. As a result, the voltage stored in capacitor Cout and made available at the output node VOUT rises to a level which exceeds the voltage at the input node VIN.

Figure 3A:
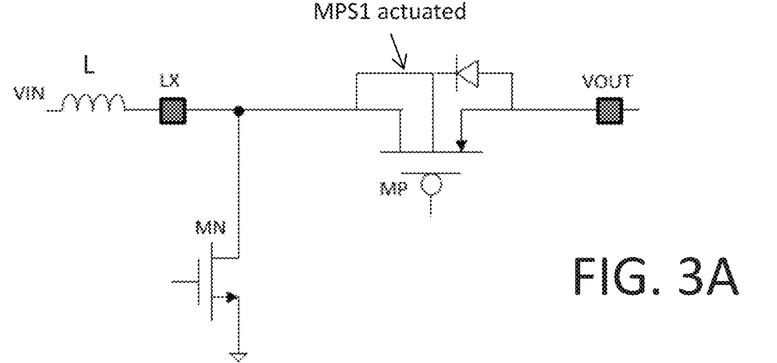
FIGS. 3A and 3B illustrate operation of the circuit of FIG. 2.
Figure 3B:
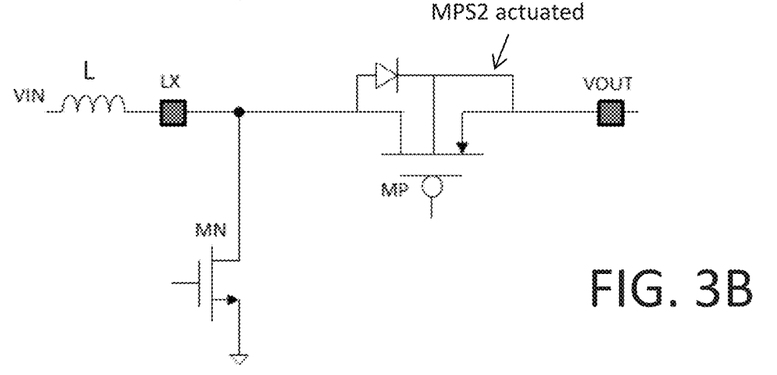
Figure 3C:
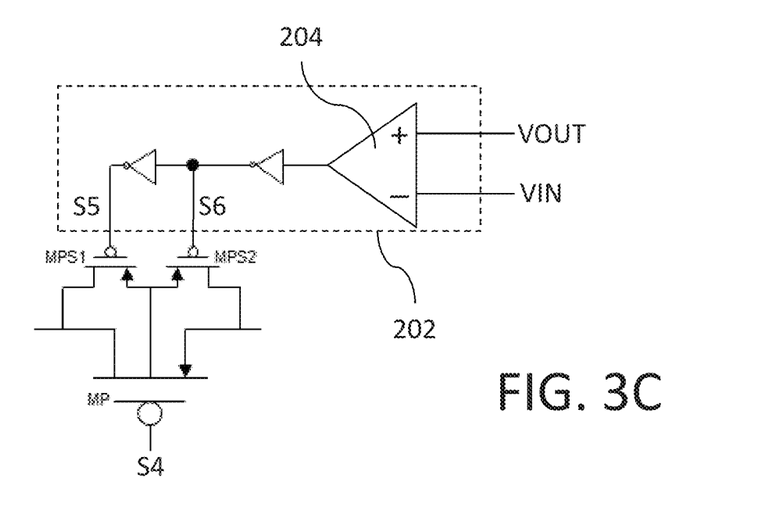
FIG. 3C is a circuit diagram for the control operation of FIG. 2.

The control circuit 202 further functions as a voltage sensor 204 to sense and compare the voltages at the nodes VIN and VOUT (see, FIG. 3C). If the booster circuit 110 is shut down and the sensing of voltages indicates that the voltage at node VIN is greater than the voltage at node VOUT, the control circuit actuates transistor MPS1 (through signal S5) and the body diode of the transistor MPS2 is reversed biased to prevent leakage current flow (FIG. 3A). When the booster circuit 110 is working and the sensing of voltages indicates that the voltage at node VOUT is greater than the voltage at node VIN, the control circuit actuates transistor MPS2 (through signal S6) and the body diode of the transistor MPS1 is reversed biased to prevent leakage current flow (FIG. 3B).

Noted drawbacks of the circuit 110 include a) there is a shutdown current associated with the operation of the amplifier/comparator (FIG. 3C); b) a PCLAMP circuit is needed to control the turn on of transistor MPS2 when the voltage at node VOUT is maintained high after shutdown and this clamp circuit will consume power; and c) the amplifier/comparator and the PCLAMP circuit occupy a large area on the integrated circuit.

Figure 4:
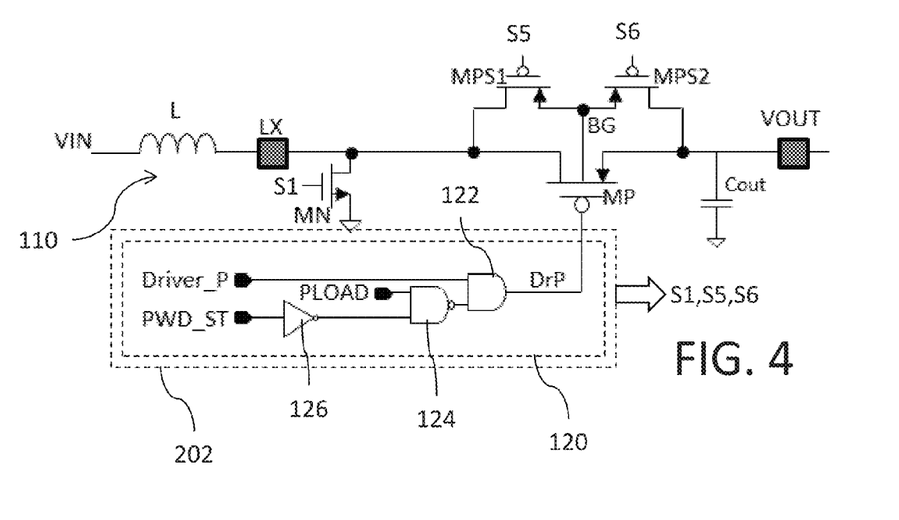
FIG. 4 is a circuit diagram for a softstart circuit for use with the circuit of FIG. 2.

Reference is now made to FIG. 4 showing a softstart circuit 120 for use with the circuit 110 of FIG. 2. The softstart circuit 120 comprises logic circuitry that may be included within the control circuit 202. The softstart circuit 120 includes a logic-AND gate 122 having an output coupled to the gate of the transistor MP and configured to generate a control signal DrP (as signal S4). The softstart circuit 120 further includes a logic-NAND gate 124 having an output coupled to a first input of the logic-AND gate 122. The second input of the logic-AND gate 122 is configured to receive a signal Driver_P. The softstart circuit 120 further includes a logic-NOT gate 126 having an output coupled to a first input of the logic-NAND gate. The second input of the logic-NAND gate 124 is configured to receive a signal PLOAD. The input of the logic-NOT gate 126 is configured to receive a signal PWD_ST. The PLOAD and PWD_ST signals are softstart signals.

Figure 5:
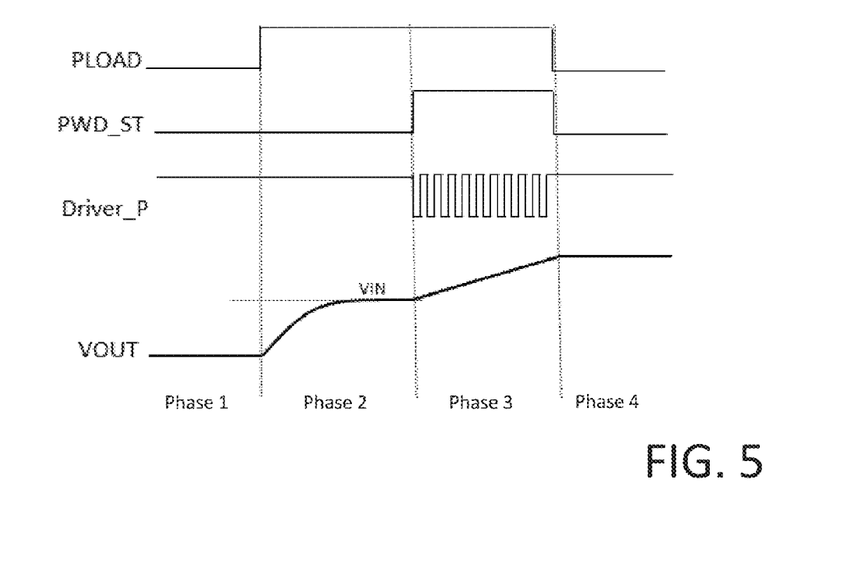
FIG. 5 is a timing diagram for circuit operation.

The operating process (shown in FIG. 5) of the circuit 110 includes four phases:

Phase 1: PLOAD=0, PWD_ST=0, Driver_P=1, DrP=1, VOUT=0. This is a shutdown phase.

Phase 2: PLOAD=1, PWR_ST=0, Driver_P=1; DrP=0 to turn on MP. The output capacitor Cout is slowly charged up to the voltage at node VIN. This is a load phase.

Phase 3: PLOAD=1, PWR_ST=1, DrP is controlled by the Driver_P signal to switch and cause the voltage at the output node VOUT to be boosted to a magnitude greater than the voltage at node VIN. Complementary actuation of the signal S1 (not shown) occurs to control transistor MN. This is a pulse drive phase.

Phase 4: if the device is shut down, but the voltage at VOUT is still needed, then PLOAD=0, PWD_ST=0 and DrP=1.

The four phases of operation can be correlated to different required actuation states of the transistors MPS1 and MPS2 as follows:

Phase 1: transistor MPS1 is actuated by the control circuit 202 through signal S5 to connect node BG to the drain of transistor MP.

Phase 2: transistor MPS1 is actuated by the control circuit 202 through signal S6 to connect node BG to the drain of transistor MP. Transistor MPS2 is deactuated.

Phase 3: transistor MPS2 is actuated by the control circuit 202 through signal S6 to connect node BG to the source of transistor MP. Transistor MPS1 is deactuated.

Phase 4: transistor MPS2 is actuated by the control circuit 202 to connect node BG to the source of transistor MP (while the voltage at node VOUT is greater than the voltage at node VIN, otherwise move to Phase 1). Transistor MPS1 is deactuated.

Figure 6:
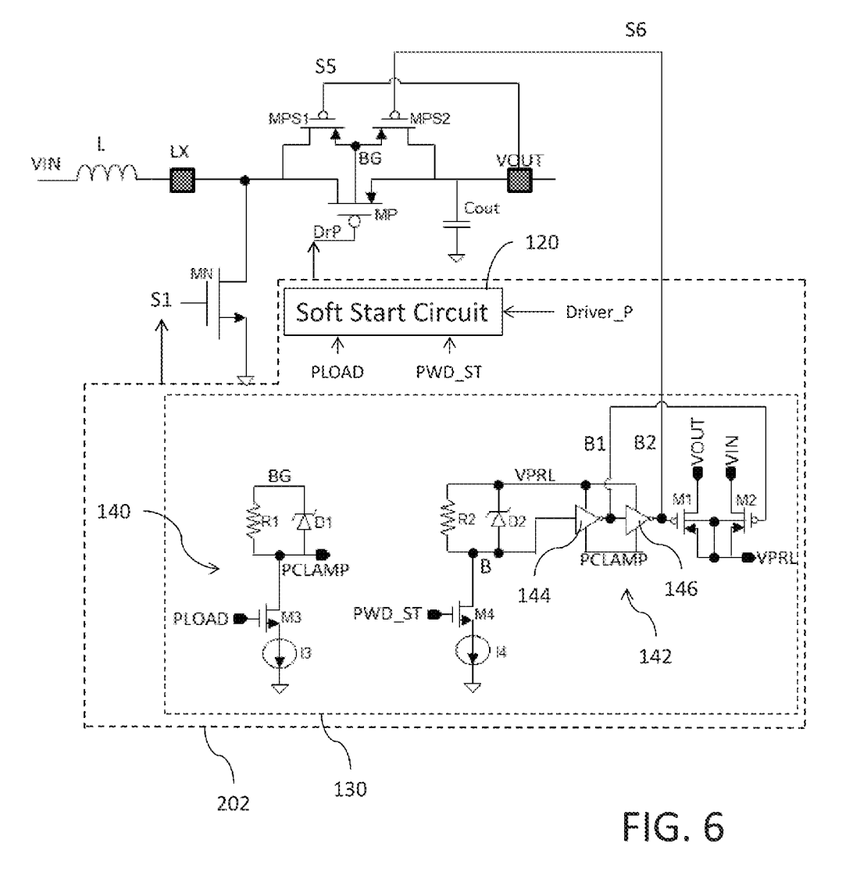
FIG. 6 is a circuit diagram for a body control circuit.

Thus, the PLOAD and PWD_ST softstart signals can be processed by a body control circuit to generate the control signals S4 and S5 to properly actuate the transistors MPS1 and MPS2 based on the operation phase. Reference is now made to FIG. 6 showing a circuit diagram for the body control circuit 130 for use in controlling the body terminal of the transistor MP in the boost converter circuit. Like references with respect to the circuit 110 of FIG. 2 refer to like or similar parts. The circuit 130 comprises circuitry that may be included within the control circuit 202. Advantageously, the comparator circuit 204 of FIG. 3C is not needed and can be removed since other circuitry is provided to control the transistors MPS1 and MPS2.

The gate terminal of transistor MPS1 is coupled to the output node VOUT. Thus, the signal S5 is equal to the voltage at the output node VOUT and actuation of the transistor MPS1 is responsive to the voltage at node VOUT which is controlled in response to the softstart signals PLOAD and PWD_ST. If PLOAD and PWD_ST are both low, the output voltage VOUT is low and transistor MPS1 is actuated. If PLOAD is high, and PWD_ST is low, the output voltage remains below the voltage at node VIN for a time and transistor MPS1 remains actuated during that time.

A clamp circuit 140 includes a transistor M3 having a control (gate) terminal configured to receive the PLOAD softstart signal. The transistor M3 may comprise an n-channel MOSFET. The source-drain path of the transistor M3 is coupled in series with a current source 13 between a node PCLAMP and the supply reference node (ground). The circuit 140 is powered from the voltage at the node BG. A resistor R1 is coupled between the node BG and the node PCLAMP. A zener diode D1 is coupled between the node BG and the node PCLAMP in parallel with the resistor R1. The circuit 140 is configured to output a clamp voltage at the node PCLAMP which depends on the signal PLOAD. When PLOAD=0, PCLAMP=$V_{BG}$ and when PLOAD=1, PCLAMP=$V_{BG}$-$V_{D1}$.

The signal S6 is generated by a drive circuit 142. The circuit 142 includes a transistor M4 having a control (gate) terminal configured to receive the PWD_ST softstart signal. The transistor M4 may comprise an n-channel MOSFET. The source-drain path of the transistor M4 is coupled in series with a current source 14 between a node B and the supply reference node (ground). The circuit 142 is powered from the voltage at a node VPRL (the voltage at node VPRL is derived from (for example, selected between) the voltages at node VOUT and node VIN as described below). A resistor R2 is coupled between the node VPRL and the node B. A zener diode D2 is coupled between the node VPRL and the node B in parallel with the resistor R2. The circuit 142 is configured to output a drive signal at the node B which depends on the signal PWD_ST. When PWD_ST=0, B=$V_{VPRL}$ and when PWD_ST=1; B=$V_{VPRL}$-$V_{D2}$.

The drive signal at node B is buffered with a low logic voltage level shift through a pair of inverter circuits 144 and 146 to generate signals at nodes B1 and B2. The inverter circuits 144 and 146 each have a first power supply terminal (for example, Vdd) coupled to the node VPRL and each have a second power supply terminal (for example, ground) coupled to the node PCLAMP. The voltage at the first power supply terminal defines the logic high voltage for the signal output from each inverter, while the voltage at the second power supply terminal defines the logic low voltage for the signal output from each inverter. In this regard, it will be noted that the voltage at the node PCLAMP, setting the logic low voltage, is shifted above the reference voltage (ground).

The circuit 140 further includes a transistor M1 having a control terminal (gate) coupled to the node B2 and a transistor M2 having a control terminal (gate) coupled to the node B1. The transistors M1 and M2 may comprise p-channel MOSFETs. The source-drain path of transistor M1 is coupled between the node VPRL and the node VOUT. The source-drain path of transistor M2 is coupled between the node VPRL and the node VIN. The circuitry including transistors M1 and M2 functions as a voltage steering circuit configured to generate the voltage at node VPRL as either the voltage at node VOUT (when transistor M1 is turned on) or the voltage at node VIN (when transistor M2 is turned on). The steering operation is responsive to the signals at nodes B1 and B2. Thus, the logic high voltage for the signal output from each inverter will be either the voltage at node VOUT or the voltage at node VIN depending on the selection made by the voltage steering circuit.

The circuit 40 is operable in each of the phases described above to properly actuate the transistors MPS1 and MPS2 as follows:

Phase 1: VOUT=0V and this voltage, when applied as signal S5 to the gate of transistor MPS1, causes the transistor MPS1 to turn on (compare to FIG. 3A) and the voltage at the node BG is equal to the voltage at the node VIN. PLOAD=0, so the transistor M3 is turned off and the voltage at the node PCLAMP is equal to the voltage at the node BG (i.e., it is equal to the voltage at node VIN) through the pull up resistor R1. In this case, the voltage at node VPRL is approximately equal to the voltage at node PCLAMP (and thus approximately equal to the voltage at the node BG). The inverters 144 and 146 are not operational. The transistors M1 and M2 are thus both turned off because the voltage at nodes B1 and B2 are both too high to turn on either transistor M1 or transistor M2. The bodies of transistors M1 and M2 are, however, coupled to the voltage at node VPRL. The signal DrP output from the softstart circuit 120 will equal the voltage at the node VBPRL and the transistor MP is turned off.

Phase 2: PLOAD=1 and PWD_ST=0. The transistor M3 turns on in response to the PLOAD signal and the voltage at node PCLAMP will be equal to the voltage at node BG minus the voltage set by the drop across zener diode D1 (for example, 5V). This voltage will set the logic low voltage level for the signals output from the inverters 144 and 146. The transistor M4 is turned off in response to the signal PWD_ST, and thus the node B has a voltage equal to the voltage at node VPRL (through the pull up resistor R2). The buffering inverter circuits 144 and 146 accordingly produce, in response to the voltage at node B, a signal at node B1 having a logic low voltage equal to the voltage at node PCLAMP and a signal at node B2 having a logic high voltage equal to the voltage at node VPRL. The transistor M2 turns on in response to the logic low voltage at the node B1 to apply the voltage at node VIN to the node VPRL. The transistors M1 and MPS2 remain off. The transistor MPS1 remains on while the voltage at node VOUT slowly charges to the voltage at the node VIN.

Phase 3: PLOAD=1 and PWD_ST=1. The voltage at node PCLAMP remains equal to the voltage at node BG minus the voltage set by the drop across zener diode D1 (for example, 5V), again setting the logic low voltage for the signals output from the inverters 144 and 146. The change in logic state of the signal PWD_ST causes transistor M4 to turn on and the voltage at node B falls to voltage at node VPRL (i.e., the voltage at node VIN) minus the voltage set by the drop across zener diode D2 (for example, 5V). The buffering inverter circuit 144 produces a signal at node B1, in response to the voltage at node B, having a logic high voltage equal to the voltage at node VPRL and inverter circuit 146 produces a signal at node B2 having a logic low voltage equal to the voltage at node PCLAMP. Transistor M2 turns off and transistor M1 turns on. The voltage at node at node VPRL is now equal to the voltage at the node VOUT (which is being boosted above the voltage at node VIN in response to switching of the signal DrP applied to the gate of transistor MP). Because the voltage at node VOUT has been boosted to at least equal to the voltage at the node VIN, the transistor MPS1 is turned off. The logic low voltage at node B2 is further applied as signal S6 to turn on the transistor MPS2.

Phase 4: for the period where the device is shut down, but where the voltage at node VOUT remains higher than the voltage at node VIN, the voltage at node VOUT causes transistor MPS1 to remain off. The voltage at node VPRL remains equal to the voltage at node VOUT through the actuation of transistor M1 because there is no current draw from node VPRL. PLOAD=0 so transistor M3 is off. This causes the voltage at node VCLAMP to equal the voltage at node VOUT (through the node BG and the action of pull up resistor R1). The signal DrP is set to the voltage at the node VPRL and in this condition the transistor MP is turned off.

The circuit 130 advantageously utilizes the signals associated with softstart In a simulation of the circuit of FIG. 6, the voltage at node VIN is 3.7V. During phase 1, the voltage at node VOUT is 0V. The simulation measured phase 1 current consumption at about 38 nA. The simulation further measured phase 3 current consumption at about 10 nA. Thus, it is noted that there is very little leakage current.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   a boost converter having:
   an input node;
   an output node;
   a rectification transistor coupled between the input and output node and having a body terminal;
   a first transistor coupled between the input node and the body terminal; and
   a second transistor coupled between the body terminal and the output node;
   a softstart circuit configured to receive a softstart signal and generate in response thereto a first control signal applied to a control terminal of the rectification transistor; and
   a drive circuit configured to generate a second control signal applied to a control terminal of the first transistor and further configured to receive the softstart signal and generate in response thereto a third control signal applied to a control terminal of the second transistor, wherein said drive circuit comprises:
   a logic inverter configured to generate said third control signal, said logic inverter having a first power supply input selectively coupled to receive first supply voltage from one of the input node and output node in response to said third control signal and a second power supply input coupled to receive a second supply voltage derived from a voltage at the body terminal.

2. The circuit of claim 1, wherein the input node is configured for connection to an inductor and the output node is configured for connection to a capacitor.

3. The circuit of claim 1, wherein a control terminal of the first transistor is controlled through the second control signal by a voltage at said output node.

4. A circuit comprising:
   a boost converter having:
   an input node;
   an output node;
   a rectification transistor coupled between the input and output node and having a body terminal;
   a first transistor coupled between the input node and the body terminal; and
   a second transistor coupled between the body terminal and the output node;
   a softstart circuit configured to receive a softstart signal and generate in response thereto a first control signal applied to a control terminal of the rectification transistor; and
   a drive circuit configured to generate a second control signal applied to a control terminal of the first transistor and further configured to receive the softstart signal and generate in response thereto a third control signal applied to a control terminal of the second transistor;
   wherein the softstart signal comprises:
   a first start signal, the softstart circuit responding to said first start signal to actuate the rectification transistor through the first control signal to charge the output node; and
   a second start signal, the softstart circuit responding to said second start signal, to permit repeated actuation of the rectification transistor through the first control signal to boost voltage at the output node.

5. The circuit of claim 4, wherein the drive circuit is configured to actuate the second transistor through the third control signal when both the first and second start signals are active.

6. A circuit, comprising:
a boost converter having:
an input node;
an output node;
a rectification transistor coupled between the input and output node and having a body terminal;
a first transistor coupled between the input node and the body terminal; and
a second transistor coupled between the body terminal and the output node;
a softstart circuit configured to receive a softstart signal and generate in response thereto a first control signal applied to a control terminal of the rectification transistor; and
a drive circuit configured to generate a second control signal applied to a control terminal of the first transistor and further configured to receive the softstart signal and generate in response thereto a third control signal applied to a control terminal of the second transistor, wherein said drive circuit comprises:
a first inverter circuit having an output coupled to the control terminal of the second transistor as the third control signal and having a first power supply terminal and a second power supply terminal;
a voltage steering circuit configured to apply one of the voltage at the input terminal or the voltage at the output terminal to the first power supply terminal in response to output of the first inverter circuit; and
a clamp circuit configured to apply a voltage derived from a voltage at the body terminal to the second power supply terminal.

7. The circuit of claim 6, wherein the softstart signal comprises a first softstart signal and a second softstart signal, wherein the clamp circuit is controlled in response to the first softstart signal and wherein the first inverter circuit is controlled in response to the second softstart signal.

8. The circuit of claim 7, further comprising a second inverter circuit having an output coupled to an input of the first inverter circuit, wherein the voltage steering circuit is further responsive to the output of the second inverter circuit and wherein the second inverter circuit is controlled in response to the second softstart signal.

9. The circuit of claim 6, wherein the first power supply terminal is a logic high signal supply terminal and the second power supply terminal is a logic low signal supply terminal, said third control signal having a voltage from the logic low supply terminal when actuating the second transistor.

10. A circuit, comprising:
a boost circuit including
a rectification transistor having first and second conduction terminals and a body terminal;
a first transistor coupled between the first conduction terminal and the body terminal; and
a second transistor coupled between the body terminal and the second conduction terminal; and
a control circuit configured to control operation of said boost circuit, the control circuit comprising:
a softstart circuit configured to receive a first softstart signal indicating a load phase and a second softstart signal indicating a pulse drive phase following said load phase, the softstart circuit operable to actuate the rectification transistor for the duration of the load phase in response to the first softstart circuit and further operable to pass a pulse signal to control actuation of the rectification transistor during the pulse drive phase; and
a body control circuit configured to control actuation of the first and second transistors in response to the first and second softstart signals, the body control circuit operable when the first softstart signal is active and the second softstart signal is deactive to actuate the first transistor and deactuate the second transistor, and further operable when the second softstart signal is active to deactuate the first transistor and actuate the second transistor.

11. The circuit of claim 10, further comprising an output node coupled to the second conduction terminal of the rectification transistor, said body control circuit comprising a circuit configured to couple the output node to the control terminal of the first transistor.

12. The circuit of claim 10, further comprising a clamp voltage generator circuit having a power supply node coupled to the body terminal of the rectification transistor and configured to generate a clamp voltage as a function of a logic state of the first softstart signal.

13. The circuit of claim 12, further comprising a first inverter circuit having a logic high supply node, a logic high supply node, an output node configured to generate a control signal for controlling actuation of the second transistor; wherein the clamp voltage is applied to the logic low supply node.

14. The circuit of claim 13, further comprising a voltage steering circuit configured to select a first or second voltage for application to the logic high supply node in response to said control signal.

15. The circuit of claim 14, wherein the first voltage is a voltage at an output of the boost circuit and the second voltage is a voltage at an input of the boost circuit.

16. The circuit of claim 14, wherein an input of the inverter is configured to receive a signal derived from the second softstart signal.

17. A method, comprising:
receiving a first softstart signal indicating operation in a load phase for a boost rectifier;
actuating a rectification transistor for the duration of the load phase in response to the first softstart circuit to generate an output voltage rising towards a level of an input voltage, said rectification transistor having first and second conduction terminals and a body terminal;
receiving a second softstart signal indicating operation in a pulse drive phase, following said load phase, for said boost rectifier;
passing a pulse signal to control repeated actuation of the rectification transistor during the pulse drive phase to generate a boosted output voltage;
actuating a first transistor coupled between the first conduction terminal and the body terminal, and deactuating a second transistor coupled between the body terminal and the second conduction terminal, during the load phase to boost said output voltage in excess of the input voltage; and
actuating the second transistor coupled between the body terminal and the second conduction terminal, and deactuating the first transistor coupled between the first conduction terminal and the body terminal, during the pulse drive phase.

18. The method of claim 17, wherein actuating a first transistor comprises actuating the first transistor as long as the output voltage is less than the input voltage.

19. The method of claim 17, wherein actuating the second transistor comprises actuating the second transistor in response to an active state of the second softstart signal.

20. The method of claim 19, further comprising:
generating a high logic level voltage for a control signal applied to a control input of the second transistor selected from the output voltage or input voltage in response to the logic state of said second softstart signal; and
generating a low logic level voltage for said control signal derived from a voltage at the body terminal of the rectification transistor.

21. The method of claim 20, wherein generating the low logic level voltage comprises selecting one of the voltage at the body terminal or a voltage offset from the voltage at the body terminal in response to the logic state of said first softstart signal.

* * * * *